(12) United States Patent
Neal et al.

(10) Patent No.: US 8,709,160 B2
(45) Date of Patent: Apr. 29, 2014

(54) DEPOSITION APPARATUS HAVING THERMAL HOOD

(75) Inventors: James W. Neal, Ellington, CT (US); Michael J. Maloney, Marlborough, CT (US); David A. Litton, Rocky Hill, CT (US); Christopher Masucci, Conventry, CT (US)

(73) Assignee: United Technologies Corporation, Hartford, CT (US)

( * ) Notice: Subject to any disclaimer, the term of this patent is extended or adjusted under 35 U.S.C. 154(b) by 1188 days.

(21) Appl. No.: 12/196,368

(22) Filed: Aug. 22, 2008

(65) Prior Publication Data
US 2010/0047474 A1 Feb. 25, 2010

(51) Int. Cl.
*C23C 16/00* (2006.01)

(52) U.S. Cl.
USPC .................................. 118/726; 118/723 FE

(58) Field of Classification Search
USPC .................................... 118/723 FE
See application file for complete search history.

(56) References Cited

U.S. PATENT DOCUMENTS

| | | | |
|---|---|---|---|
| 4,351,267 A | 9/1982 | Kalbskopf | |
| 4,816,293 A | 3/1989 | Hiramoto | |
| 4,828,872 A | 5/1989 | Bauer | |
| 4,857,798 A * | 8/1989 | Ford | 313/487 |
| 5,180,612 A * | 1/1993 | Rendell | 427/372.2 |
| 5,534,314 A | 7/1996 | Wadley | |
| 5,998,003 A * | 12/1999 | Courtright et al. | 428/216 |
| 6,177,200 B1 | 1/2001 | Maloney | |
| 6,255,001 B1 | 7/2001 | Darolia | |
| 6,284,323 B1 | 9/2001 | Maloney | |
| 6,447,854 B1 | 9/2002 | Rigney | |
| 6,482,537 B1 | 11/2002 | Strangman | |
| 6,508,632 B1 * | 1/2003 | Conte et al. | 417/48 |
| 7,014,889 B2 | 3/2006 | Groves | |
| 7,022,948 B2 * | 4/2006 | Shang et al. | 219/390 |
| 7,166,168 B1 * | 1/2007 | Heller et al. | 118/725 |
| 2003/0203127 A1 | 10/2003 | Bruce | |
| 2005/0255242 A1 | 11/2005 | Hass | |
| 2006/0062912 A1 * | 3/2006 | Wortman et al. | 427/248.1 |
| 2006/0196414 A1 * | 9/2006 | Schuhmacher et al. | 118/50 |
| 2007/0172703 A1 | 7/2007 | Freling | |
| 2007/0207266 A1 | 9/2007 | Lemke | |
| 2007/0234959 A1 * | 10/2007 | Nakanishi et al. | 118/720 |

FOREIGN PATENT DOCUMENTS

| | | |
|---|---|---|
| DE | 19632410 C1 | 4/1997 |
| EP | 0969117 A2 | 1/2000 |
| EP | 1621647 A2 | 2/2006 |
| JP | 2006045674 | 2/2006 |
| JP | 2007192219 | 8/2007 |
| WO | WO01/57288 A | 8/2001 |
| WO | 03/028428 | 4/2003 |
| WO | 2004/011688 | 2/2004 |
| WO | 2004/048632 | 6/2004 |

OTHER PUBLICATIONS

European Search Report mailed on Dec. 29, 2009 for EP09252044.

* cited by examiner

*Primary Examiner* — Keath Chen
(74) *Attorney, Agent, or Firm* — Carlson, Gaskey & Olds, P.C.

(57) ABSTRACT

A deposition apparatus includes a coating chamber and a coating zone within the coating chamber for coating work pieces. A heating source heats the coating zone, and a thermal hood within the coating chamber is located adjacent to the coating zone for controlling a temperature of the coating zone.

16 Claims, 1 Drawing Sheet

DEPOSITION APPARATUS HAVING THERMAL HOOD

BACKGROUND OF THE INVENTION

This disclosure relates to an apparatus for depositing a coating on a work piece and, more particularly, to a deposition apparatus having a thermal hood for controlling a temperature within a coating zone.

Physical vapor deposition ("PVD") is one common method for coating a substrate, such as gas turbine engine airfoils. To deposit thermal barrier coatings on gas turbine engine airfoils, conventional Electron Beam Physical Vapor Deposition (EB-PVD) may utilize an electron beam gun to melt and vaporize a source material in one or more crucibles within a deposition chamber and deposit the source material onto the substrate. Heaters within the deposition chamber may be used to heat the substrate to a predetermined temperature to facilitate the coating process. However, the source material coats the heaters over time and reduces the capacity of the heaters to control the temperature of the substrate. Temperature variation may contribute to forming undesirable oxidation phases on the surface of the substrate. Thus, there is a need for the disclosed deposition apparatus that provides enhanced temperature control.

SUMMARY OF THE INVENTION

An example deposition apparatus includes a coating chamber and a coating zone within the coating chamber for coating work pieces. A heating source heats the coating zone, and a thermal hood within the coating chamber is located adjacent to the coating zone for controlling the temperature of the coating zone.

In another aspect, an example deposition apparatus includes a coating chamber, a coating zone within the coating chamber for coating work pieces, and a heating source comprising a media within the coating chamber. At least one electron beam source is operative for emitting an electron beam onto the media to generate radiant heat. A semi-cylindrical thermal hood within the coating chamber at least partially surrounds the coating zone for controlling a temperature of the coating zone.

An example method for use with a deposition apparatus includes controlling a temperature within a coating zone in a coating chamber using a thermal hood adjacent to the coating zone.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
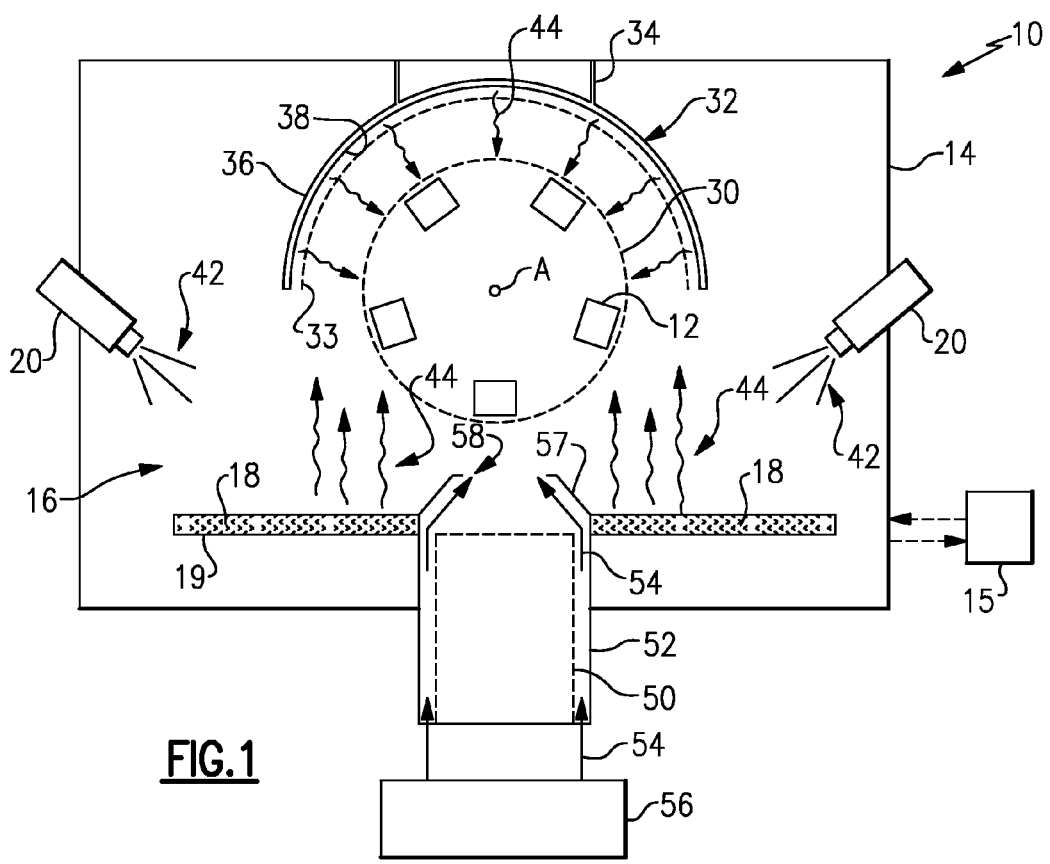
FIG. 1 illustrates selected portions of an example deposition apparatus.

FIG. 1 illustrates selected portions of an example deposition apparatus 10 for depositing a coating on one or more work pieces 12 via physical vapor deposition ("PVD"). In the illustrated example, the deposition apparatus 10 is adapted for directed vapor electron beam PVD, although it is to be understood that other types of deposition equipment may also benefit from the disclosed examples.

As can be appreciated, the work pieces 12 are not limited to any particular type. For instance, the work pieces 12 may be gas turbine engine components, such as airfoils (e.g., blades and vanes). Additionally, the type of coating deposited may be any desired coating that is suitable for vapor deposition. For example, the coating may be a ceramic thermal barrier coating and may include gadolinia, zirconia, or combinations thereof, or may if desired be a metallic coating.

In the illustrated example, the deposition apparatus 10 includes a coating chamber 14 for containing the work pieces 12 during the coating process. For instance, the coating chamber 14 may be a vacuum chamber and may include various ports for evacuating the interior of the coating chamber 14 or for selectively introducing gases that are to be used in the coating process. Optionally, a pump 15 may circulate a coolant (e.g., water) through walls of the coating chamber 14 to control the temperature of the walls of the coating chamber 14.

A heating source 16 may be located within the coating chamber 14 for heating the work pieces 12 to a predetermined temperature. For instance, to facilitate good adhesion of thermal barrier coatings to the work pieces 12, the temperature of the work pieces 12 may be tightly controlled. In the disclosed example, the heating source 16 includes a media 18 that may be used to radiate heat, as will be discussed below. The media 18 may be any type of media that radiates heat. For instance, the media 18 may include particles of a ceramic material in a water-cooled tray 19. In one example, the ceramic material is equivalent to the coating that is to be deposited onto the work pieces 12 to avoid contaminating the work pieces 12 with foreign substances. In a further example, the media 18 includes yttria, zirconia, or combinations thereof.

At least one electron beam source 20 is mounted relative to the coating chamber 14 for heating the media 18 and depositing the coating. The disclosed example illustrates two electron beam sources 20. However, given this description, one of ordinary skill in the art will recognize that a single source or additional sources may be used to meet the needs of a particular application or coating process.

The work pieces 12 are mounted within a coating zone 30 within the coating chamber 14. For instance, the coating zone 30 is the spatial volume where the work pieces 12 will be coated. The work pieces 12 may be mounted in the coating zone 30 using a mounting fixture, such as a cylindrical fixture.

A thermal hood 32 is located adjacent to the coating zone 30. The thermal hood 32 may be mounted to the walls of the coating chamber 14 using brackets 34, for example. Alternatively, the thermal hood 32 may be mounted through the coating chamber 14 to an outside support, supported on the fixture that supports the work pieces 12, supported on a stand within the coating chamber 14, or mounted in any other suitable manner.

The thermal hood 32 may be made of any of a variety of different materials for withstanding the conditions within the coating chamber 14. For example, the thermal hood 32 may be made of a solid, continuous piece of nickel alloy or ceramic material to withstand temperatures over 1800° F. (982° C.) during the coating process and effectively deflect heat. Given this description, one of ordinary sill in the art will recognize other type of suitable materials for the thermal hood 32.

In the illustrated example, the thermal hood 32 at least partially surrounds the coating zone 30. That is, as shown, the thermal hood 32 wraps circumferentially at least part way around the perimeter of the coating zone 30 such that the coating zone 30 is within the volume of the thermal hood 32. The extent that the thermal hood 32 wraps around the perimeter may vary in other examples, but in the disclosed example the thermal hood 32 wraps approximately 180° around the perimeter.

Figure 2:
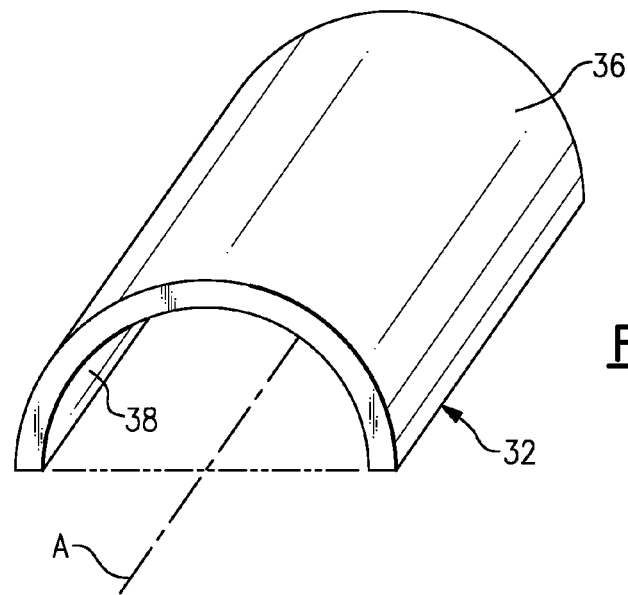
FIG. 2 illustrates an example thermal hood of the deposition apparatus.

As illustrated also in FIG. 2, the disclosed thermal hood 32 may include a convex outer surface 36 that faces in a direction away from the coating zone 30 and a concave inner surface 38 that faces in a direction toward the coating zone 30. For example, the thermal hood 32 is semi-cylindrical relative to a central longitudinal axis A. However, the thermal hood 32 may be any curved shape or may have another type of shape in other examples.

The electron beam sources 20 may be activated to emit electron beams 42 onto the media 18. The electron beams 42 heat the media 18 and produce radiant heat 44 that radiates toward the coating zone 30 and thermal hood 32. For example, a controller (not shown) may control focus, filament current, scanning area (power density), and/or other parameters of the electron beam sources 20 to provide a desired amount of heat before and/or during the coating process. The electron beam sources 20 may also raster relatively low current-density electron beams 42 across the work pieces 12 prior to or during coating to directly heat the work pieces 12.

The thermal hood 32 collects the radiant heat 44 within the coating zone 30 to uniformly heat the work pieces 12. For instance, the concave inner surface 38 of the thermal hood 32 deflects the radiant heat 44 from the media 18 toward the coating zone 30 and limits heat loss through the walls of the coating chamber 14. Thus, the work pieces 12 are heated in one direction from the media 18 and in another direction from the deflected radiant heat 44. In this manner, the thermal hood 32 provides rapid and controlled heating of the work pieces 12 to a predetermined temperature. As can be appreciated, the shape of the thermal hood 32 may influence the heat-collecting effectiveness. For instance, the extent that the thermal hood 32 wraps around the perimeter of the coating zone may influence the amount of heat collected. That is, a relatively greater degree of wrapping may collect more heat than a relative lesser degree of wrapping.

In one example, the thermal hood 32 provides the benefit of enabling a user to establish a temperature variation across the coating zone 30 to a variation of less than 1% from a predetermined target temperature. Thus, the work pieces 12 in the coating zone 30 do not vary in temperature by more than 1% from the target temperature. Additionally, using the thermal hood 32 to control temperature reduces the burden on the electron beam sources 20 of controlling the temperature. Therefore, the thermal hood 32 may also allow greater dedication of the operating parameters of the electron beam sources 20 to affect desired coating results.

In the coating process, an ingot 50 is the source material for coating the work pieces 12. The deposition apparatus 10 introduces the ingot 50 into the coating chamber 14 through a crucible 52. Although only one crucible 52 is shown, the coating chamber 14 may utilize multiple crucibles and ingots 50. A nozzle 57 on the crucible 52 includes an orifice 58 for directing a carrier gas 54 from a pressurized gas source 56 in a desired direction toward the work pieces 12 (e.g., directed vapor deposition). The nozzle 57 tapers from the sides of the crucible 52 to the orifice 58 to "jet" the carrier gas 54 toward the work pieces 12.

The electron beams 42 heat and evaporate the ingot 50. The carrier gas 54 directed from the orifice 58 carries the evaporated ingot material toward the work pieces 12. The evaporated ingot material deposits onto the surfaces of the work pieces 12. As can be appreciated, some of the evaporated material may also be deposited onto the thermal hood 32. In this regard, the thermal hood 32 may be made of the nickel alloy or ceramic material as mentioned above, or another heat resistant material that is relatively nonreactive with the ingot material. Additionally, one or more preliminary coating runs may be conducted prior to coating any work pieces to buildup the coating on the thermal hood 32 and stabilize the thermal properties of the thermal hood 32.

Optionally, a screen 33 (FIG. 1) may be mounted between the thermal hood 32 and the coating zone 30. For instance, the screen 33 may have a porous mesh structure formed from wires of a high temperature material, such a metallic alloy. In one example, the screen 33 is formed from a nickel alloy. The screen 33 blocks any coating material that might spall from the thermal hood 32 from falling into the coating zone 30 and interfering with the coating process. The screen 33 may be cleaned or changed periodically if coating material build up on the screen 33, or to remove any coating spall that is caught.

Additionally, the thermal hood 32 may have an additional benefit for the disclosed deposition apparatus 10 that is adapted for directed vapor deposition with the nozzle 57. For example, the operating pressure within the coating chamber 14 is relatively higher than operating pressures used for conventional PVD (non-directed). The higher pressure attenuates the electron beams 42, thereby making the electron beams 42 less effective for heating. One option to compensate for the attenuation is to increase beam electric current; however, doing so may increase the operating expense. By providing rapid and uniform heating, the thermal hood 32 may effectively lower the operating expense by reducing the need to compensate for the attenuation.

The temperature across the coating zone 30 (and thus the temperature of the work pieces 12) is generally a function of the total electric current of the electron beam source(s) 20. Input factors such as beam spot energy, voltage, scanning frequency threshold, the water-cooled tray 19, stand-off distance between the crucible 52 and the coating zone 30, and gas flow rate may influence the total electric current. However, if the factors are held relatively constant, the thermal hood 32 facilitates a generally linear correlation between total electric current for a given voltage and the temperature.

As mentioned above, the work pieces 12 may be gas turbine engine components. For example the components are made of a nickel alloy and coated with a bond coat. For example, the bond coat may include MCrAlY, where the M includes at least one of nickel, cobalt, iron, or a combination thereof, Cr is chromium, Al is aluminum, and Y is yttrium. The deposition apparatus 10 provides the benefit of rapidly heating the components to a predetermined target temperature to thereby form an alpha-alumina oxide phase of the bond coat and avoid formation of undesirable oxide phases of the bond coat that typically occur at temperatures under about 1800° F. (982° C.).

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure.

The scope of legal protection given to this disclosure can only be determined by studying the following claims.

What is claimed is:

1. A deposition apparatus comprising:
a coating chamber;
a coating zone configured to receive work pieces within the coating chamber for coating the work pieces;
a heating source for heating the coating zone; and
a thermal hood within the coating chamber adjacent to the coating zone for controlling a temperature of the coating zone, the thermal hood comprising a semi-cylindrical wall that wraps partially around the coating zone such that the coating zone is partially within the volume of the semi-cylindrical wall.

2. The deposition apparatus as recited in claim 1, wherein the thermal hood is a solid and continuous piece.

3. The deposition apparatus as recited in claim 1, wherein the thermal hood is comprised of a nickel alloy.

4. The deposition apparatus as recited in claim 1, wherein the thermal hood is comprised of a ceramic.

5. The deposition apparatus as recited in claim 1, wherein the heating source comprises particles of a ceramic media.

6. The deposition apparatus as recited in claim 5, wherein the coating zone is located between the ceramic media and the thermal hood.

7. The deposition apparatus as recited in claim 1, further comprising a pressurized gas source, a crucible for carrying a coating source material, and a nozzle adjacent the crucible, the nozzle being operative to jet gas from the pressurized gas source toward the coating zone.

8. The deposition apparatus as recited in claim 1, further comprising a screen between the thermal hood and the coating zone.

9. The deposition apparatus as recited in claim 8, wherein the screen is a porous wire mesh.

10. The deposition apparatus as recited in claim 9, wherein the screen is a nickel alloy.

11. The deposition apparatus as recited in claim 1, wherein the semi-cylindrical wall wraps approximately 180° around the perimeter of the coating zone.

12. A deposition apparatus comprising:
a coating chamber;
a coating zone configured to receive work pieces within the coating chamber for coating work pieces;
a heating source comprising a media within the coating chamber;
at least one electron beam source operative for emitting an electron beam onto the media to generate radiant heat; and
a semi-cylindrical thermal hood within the coating chamber that at least partially surrounds the coating zone such that the coating zone is partially within the volume of the semi-cylindrical thermal hood for controlling a temperature of the coating zone.

13. The deposition apparatus as recited in claim 12, wherein the coating chamber is fluid-cooled.

14. The deposition apparatus as recited in claim 12, wherein the media is comprised of particles of a ceramic material.

15. The deposition apparatus as recited in claim 14, wherein the ceramic material includes at least one of zirconia or yttria.

16. The deposition apparatus as recited in claim 12, wherein the semi-cylindrical thermal hood wraps approximately 180° around the perimeter of the coating zone.

* * * * *